United States Patent [19]

Stankey

[11] Patent Number: 4,584,539

[45] Date of Patent: Apr. 22, 1986

[54] FREQUENCY-AGILE, MULTI-CHANNEL, MICROWAVE FREQUENCY SYNTHESIZER

[75] Inventor: John E. Stankey, Diamond Bar, Calif.

[73] Assignee: General Dynamics Pomona Division, Pomona, Calif.

[21] Appl. No.: 675,903

[22] Filed: Nov. 28, 1984

[51] Int. Cl.[4] .............................................. H03L 7/20
[52] U.S. Cl. ...................................... 331/16; 331/19; 331/25; 331/30; 331/116 R
[58] Field of Search ..................... 331/1 A, 10, 16, 18, 331/19, 25, 30

[56] References Cited

U.S. PATENT DOCUMENTS

| | | | |
|---|---|---|---|
| 3,401,353 | 9/1968 | Hughes | 331/18 |
| 3,611,175 | 10/1971 | Boelke | 331/1 A |
| 3,676,794 | 7/1972 | Bidell et al. | 331/1 A |
| 4,061,973 | 12/1977 | Reimers et al. | 331/18 |
| 4,105,946 | 8/1978 | Ikeda | 331/1 A |
| 4,105,948 | 8/1978 | Wolkstein | 331/179 |
| 4,126,861 | 11/1978 | Witte et al. | 331/47 |
| 4,156,205 | 5/1979 | Kadin et al. | 331/179 |
| 4,225,828 | 9/1980 | Watanabe et al. | 331/1 A |
| 4,234,929 | 11/1980 | Riley, Jr. | 331/1 A |
| 4,249,138 | 2/1981 | Bell | 331/1 A |
| 4,360,788 | 11/1982 | Erps et al. | 331/1 A |

*Primary Examiner*—Siegfried H. Grimm
*Attorney, Agent, or Firm*—Neil F. Martin; Edward W. Callan; Edward B. Johnson

[57] ABSTRACT

A multi-channel frequency synthesizer, including a crystal oscillator circuit that may be selectively operated to provide a reference signal at a selected reference frequency that is one of a given plural number of frequencies; an IF generator for processing the reference signal to provide an IF signal at a selected intermediate frequency that is one of a given plural number of submultiples of the selected reference frequency; a comb generator for processing the reference signal to provide a comb of signals separated from each other by the selected reference frequency; and a phase-locked loop. The phase-locked loop includes a voltage controlled oscillator for providing a loop output signal at a selected synthesizer output frequency; a microwave directional coupler coupled to the output of the voltage controlled oscillator for providing a sample signal at the phase and frequency of the loop output signal; a mixer for mixing the sample signal with the comb of signals to provide a plurality of upper and lower sideband signals with respect to the synthesizer output frequency that are separated from each other by the selected reference frequency; and a phase detector for comparing the phase of the IF signal to the phase of the one of the plurality of sideband signals that is at a frequency closest to the intermediate frequency to thereby provide a comparison output signal. The synthesizer further includes a range selector circuit for providing a selected range control signal that is one of a given plural number of range control signals representative of different frequency ranges; and a summing device means for combining the selected range control signal with the comparison output signal to tune the voltage controlled oscillator to provide the loop output signal at the selected synthesizer output frequency.

5 Claims, 2 Drawing Figures

FREQUENCY-AGILE, MULTI-CHANNEL, MICROWAVE FREQUENCY SYNTHESIZER

BACKGROUND OF THE INVENTION

The present invention generally pertains to frequency synthesizers and is particularly directed to an improvement in frequency-agile, mulit-channel frequency synthesizers.

Prior art frequency synthesizers typically utilize a phase-locked loop which produces a loop output signal at a selected synthesizer output frequency in response to a phase comparison of a signal derived from a sample of the loop output signal and a signal derived from a reference signal having a predetermined frequency. In various different prior art frequency synthesizers one or both of the signals that is compared is derived by frequency dividing by one of a given number of different predetermined factors, whereby the synthesizer output frequency is varied by varying the selected frequency-division factor. In a typical prior art frequency synthesizer, the frequency division factor is provided by a frequency divider within the phase-locked loop. Typical prior art frequency synthesizers utilizing a phase-locked loop are described in U.S. Pat. Nos. 4,360,788 to Erps et al; 4,249,138 to Bell; 4,234,929 to Riley, Jr.; 4,225,828 to Watanabe et al; 4,156,205 to Kadin et al; 4,105,948 to Wolkstein; 4,105,946 to Ikeda; 4,061,973 to Reimers et al; 3,676,794 to Bidell et al; 3,611,175 to Boelke; and 3,401,353 to Hughes. Some of the various systems described therein include such techniques for deriving different ones of the compared signals as mixing the sample signal with a selected variable frequency control signal (Erps et al); and mixing sample signal with a large number of harmonics of the reference signal (Kadin et al). Wolkstein describes summing and analog range selection voltage signal with the comparison signal and providing the resultant signal to control a voltage-controlled oscillator in the phase-locked loop; processing an input signal identifying a selected synthesizer output frequency to provide both a range select signal from which the analog rang selection voltage signal is derived and a signal indicating a selected frequency-division factor.

It is the object of the present invention to provide an improved multi-channel frequency synthesizer that is capable of providing a large number of frequency channels with great agility for use as a local oscillator in frequency-hopping application, and yet which is simple and reliable in construction and operation.

SUMMARY OF THE INVENTION

The present invention is a frequency agile multichannel frequency synthesizer, that includes a cyrstal oscillator circuit that may be selectively operated to provide a reference signal at a selected reference frequency that is one of a given plural number of frequencies; an IF generator for processing the reference signal to provide an IF signal at a selected intermediate frequency that is one of a given plural number of submultiples of the selected reference frequency; a comb generator for processing the reference signal to provide a comb of signals separated from each other by the selected reference frequency; and a phase-locked loop. The phase-locked loop includes a voltage controlled oscillator for providing a loop output signal at a selected synthesizer output frequency; means coupled to the output of the voltage controlled oscillator for providing a sample signal at the phase and frequency of the loop output signal; a mixer for mixing the sample signal with the comb of signals to provide a plurality of upper and lower sideband signals with respect to the synthesizer output frequency that are separated from each other by the selected reference frequency; and a phase detector for comparing the phase of the IF signal to the phase of the one of the plurality of sideband signals that is at a frequency closest to the intermediate frequency to thereby provide a comparison output signal. The synthesizer further includes a range selector circuit for providing a selected range control signal that is one of a given plural number of range control signals representative of different frequency ranges; and means for combining the selected range control signal with the comparison output signal to tune the voltage controlled oscillator to provide the loop output signal at the selected synthesizer output frequency.

The frequency synthesizer of the present invention preferably further includes a processor for processing an input signal identifying the selected synthesizer output frequency to provide a crystal-select signal, an intermediate frequency select signal, a sideband select signal and a range select signal. The crystal oscillator circuit determines which frequency is selected as the reference frequency in accordance with the crystal-select signal. The IF generator determines which submultiple is applicable in accordance with the intermediate frequency-select signal. The phase detector determines whether the upper or lower sideband signals are compared with the IF signal in accordance with the sideband-select signal; and the range selector circuit determines which range control signal is provided in accordance with the range select signal.

Additional features of the present invention are discussed in relation to the description of the preferred embodiment.

DETAILED DESCRIPTION OF THE INVENTION

Figure 1:
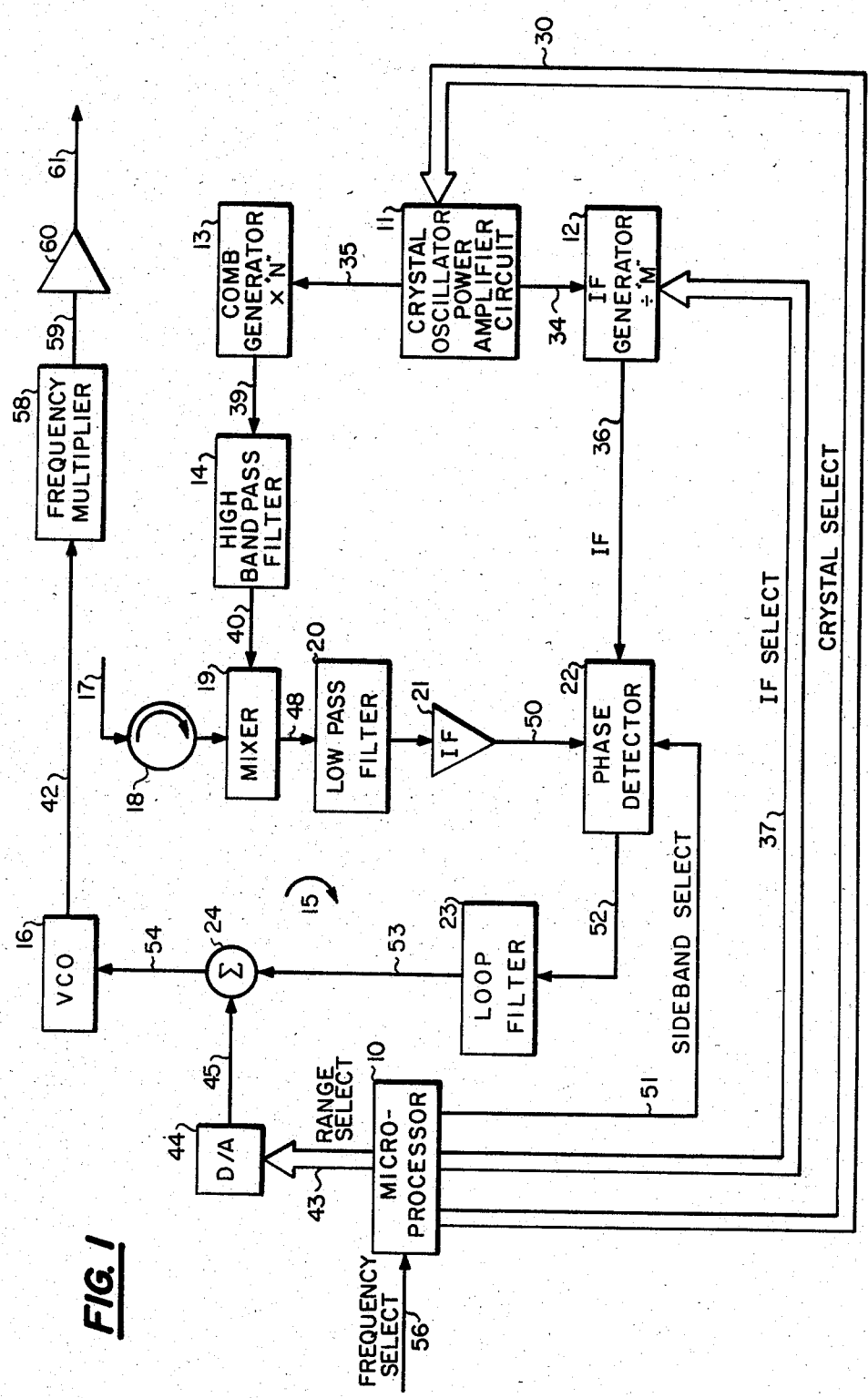
FIG. 1 is a block diagram of a preferred embodiment of the frequency synthesizer of the present invention.

Referring to FIG. 1, a preferred embodiment of the frequency synthesizer of the present invention includes a microprocessor 10, a crystal oscillator circuit 11, an intermediate frequency (IF) generator 12, a comb generator 13, a high frequency band pass filter 14, and a phase-locked loop 15. The phase-locked loop 15 includes a voltage-controlled oscillator (VCO) 16, a directional microwave coupler 17, a microwave circulator/isolator 18, a mixer 19, a low pass filter 20, an IF amplifier 21, a phase detector 22, a loop filter 23, and a summing device 24.

The crystal oscillator circuit 11 may be selectively operted to provide a reference signal at a selected reference frequency $F_X$ that is one of two different frequencies $F_1$ and $F_2$.

Figure 2:
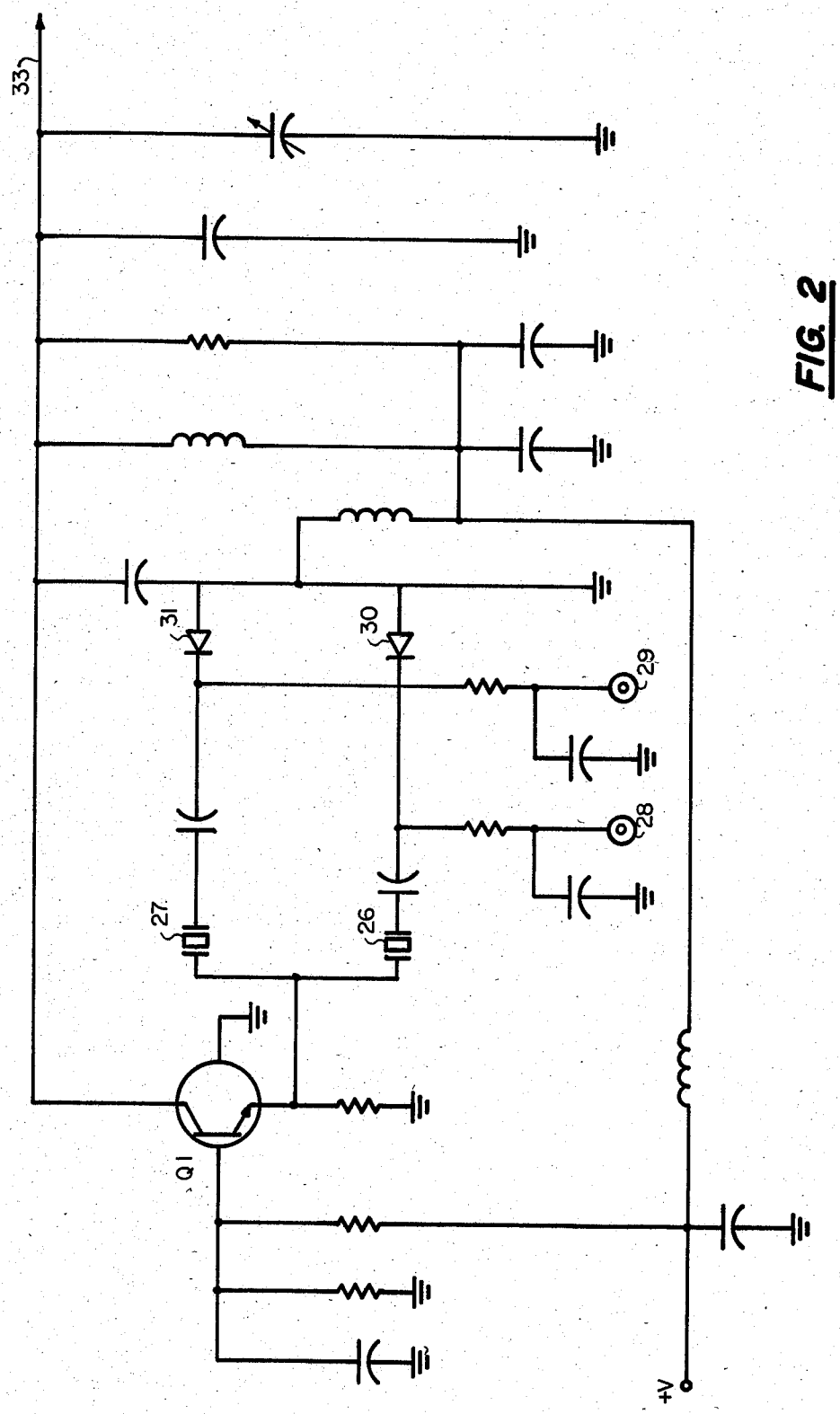
FIG. 2 is a schematic circuit diagram of the crystal oscillator portion of the crystal oscillator circuit in the frequency synthesizer of FIG. 1.

The crystal oscillator circuit 11 includes a crystal oscillator, which is shown in FIG. 2, followed by a buffer amplifier, a power amplifier and two branches of low pass filters. Referring to FIG. 2, the crystal oscillator includes two crystals 26, 27 having different characteristics defining the two different frequencies $F_1$ and $F_2$ at which the oscillator may be selectively operated. One or the other of the two crystals 26, 27 is effectively removed from the oscillator while the other one of the two crystals is included in the oscillator by application of a circuit ground signal to whichever one of the terminals 28 and 29 that is connected to the crystals 26 and 27 respectively that is not to be included in the oscillator to provide the selected reference frequency $F_X$. The signals applied to the terminals 28 and 29 are in effect crystal-select signals which determine the reference frequency $F_X$ of the reference signal provided by the crystal oscillator circuit 11. The crystal-select signals are applied to the terminals 28 and 29 by the microprocessor 10 via lines 30. (FIG. 1.)

The crystal oscillator is a Colpitts oscillator which uses Schottky diodes 30, 31. The active oscillator element Q1 is provided with collector feedback in phase to the emitter, with the crystal operating as a series selective filter. The collector selectively is sufficient to allow overtone crystal use. The crystal oscillator provides a reference signal at the reference frequency $F_X$ on line 33 to the buffer amplifier (not shown) which in turn provides the reference signal to the power amplifier (not shown). The power amplifier has two stages. The reference signal is amplified by the first stage of the power amplifier and passed through one of the low pass filter branches to the IF generator 12 via line 34. The reference signal also is further amplified by the second stage of the power amplifier and passed through the low pass filter branch to the comb generator 13 via line 35.

The IF generator 12 frequency divides the reference signal received on line 34 by a selected factor "M" to provide an IF signal on line 36 having a selected intermediate frequency that is a submultiple of the selected reference frequency $F_X$. The frequency-division factor "M" is one of a given number of predetermined factors, 6, 4 or 3. The applicable factor "M" is selected in accordance with an IF-select signal received on lines 37 from the microprocessor 10. Thus the selected intermediate frequency on line 36 will be either $F_X/6$, $F_X/4$ or $F_X/3$. $F_X$ is either $F_1$ or $F_2$.

Thus one of six different intermediate frequencies may be selected in accordance with the combination of crystal-select signals and IF-select signals respectively provided by the microprocessor 10 on lines 30 and 37.

The comb generator processes the reference signal on line 35 to provide a comb of "N" signals on line 39 separated from each other by the reference frequency $F_X$ of the reference signal on line 35. "N" is an integer on the order of 100 to 200. The two selectable frequencies $F_1$ and $F_2$ available from the crystal oscillator circuit 11 as the reference frequency $F_X$ both are in the neighborhood of 50 MHz and differ from each other by less than 100 KHz so that only a single crystal oscillator is required for operation at either $F_1$ or $F_2$ as the selected reference frequency $F_X$.

The high band pass filter 14 filters the comb of "N" signals on line 39 and passes only the higher frequency signals to the mixer 19 via line 40 so as not to overload the mixer 19.

In the phase-locked loop 15, the VCO 16 provides a loop output signal on line 42 at a selected synthesizer output frequency $F_O$. The VCO 16 is caused to operate in a selected frequency range by a range-select signal provided by the microprocessor 10 on line 43 to a digital-to-analog (D/A) converter 44, which converts the range select signal to an analog range-control signal on line 45. The analog range-control signal on line 45 is applied via the summing device 24 to the VCO 16. The different frequency ranges defined by the different range-select signals on line 43 and the corresponding range-control signals on line 45 are approximately $F_X$ in width whereby the VCO 16 operates at a selected output frequency $F_O$ defined by the following equation:

$$F_O = N'F_X \pm F_X/M \qquad \text{(Equation 1)}$$

wherein $N'F_X$ is the one of the N different frequencies of the comb of signals on line 39 that causes the synthesizer output frequency $F_O$ to fall within the frequency range defined by the range-select signal on line 43. $N'F_X$ corresponds to the center frequency of the respective selected frequency range. There may be as many as N different predetermined frequency ranges. In the preferred embodiment, the different frequency ranges that may be selected for the VCO 16 in accordance with the range-select signal provided on line 43 by the microprocessor 10 are all in the X-band of frequencies. The plus or minus $F_x/M$ quantity denotes the upper or lower sideband as determined by the sideband select signal on line 51.

The directional microwave coupler 17 and the microwave circulator/isolator 18 cooperate to provide a sample signal on line 47 at the phase and frequency of the loop output signal on line 42. The circulator/isolator 18 isolates the loop output line 42 from the mixer 19 in order to minimize the appearance of cross product of mixing signals or the comb of signals from line 40 in the loop output signal of the frequency synthesizer on line 42.

The mixer 19 mixes the sample signal on line 47 with the comb of signals on line 40 to provide upper and lower sideband signals on line 48. The upper and lower sidebands are with respect to the synthesizer output frequency $F_O$ and are separated from each other by the selected reference frequency $F_X$. The sideband signals on line 48 are passed through the low-pass filter 20 and amplified by the IF amplifier 21 to provide the upper and lower sideband signals on line 50.

The phase detector 22 compares the phase of the IF signal on line 36 to the phase of the one of the plurality of either the upper or lower sideband signals on line 50 that is at a frequency closest to the selected IF frequency of the IF signal on line 36. Either the upper sideband signals or lower sideband signals on line 50 are selected for the phase comparison in response to a sideband-select signal on line 51 from the microprocessor 10.

As a result of the phase comparison by the phase detector 22 a comparison output signal is provided on line 52. The comparison output signal on line 52 is passed through the loop filter circuit 23 to provide the comparison output signal on line 53 at a rate that is appropriate for combination in the summing device 24 with the range-control signal from line 45.

The summing device 24 combines the comparison output signal on line 53 with the range-control signal on line 45 to provide a VCO control signal on line 54 for tuning the VCO 16 to provide the loop output signal on line 42 at the selected synthesizer output frequency.

The microprocessor responds to a frequency select input signal on line 56 identifying the selected synthesizer output frequency to provide the crystal-select signal on lines 30, the IF-select signal on lines 37, the range-select signal on lines 43 and the sideband-select signal on line 51.

The synthesizer optionally may further include a frequency multiplier 58 for doubling the frequency $F_O$ of the synthesizer output signal on line 42 so as to provide an output signal in the Ku band on line 59. An output amplifier 60 amplifies the signal on line 59 (or the synthesizer output signal on line 42 if the multiplier 58 is not included) to provide on amplified output signal on line 61.

The frequency synthesizer of the present invention provides equal channel spacing without requiring any frequency dividers in the phase-locked loop 15. By not including frequency dividers within the phase-locked loop 15, delays associated with frequency division and concomitant bandwidth limitations are not introduced into the loop 15. Also spurious responses associated with frequency dividers also are not introduced into the loop 15. Accordingly, the loop has a wider bandwidth and a quicker more agile response to changes in the selected synthesizer output frequency indicated by the frequency select input signal on line 56.

I claim:

1. A multi-channel frequency synthesizer, comprising
    a crystal oscillator circuit that may be selectively operated to provide a reference signal at a selected reference frequency that is one of a given plural number of frequencies;
    an IF generator for processing the reference signal to provide an IF signal at a selected intermediate frequency that is one of a given plural number of submultiples of the selected reference frequency;
    a comb generator for processing the reference signal to provide a comb or signals separated from each other by the selected reference frequency; and
    a phase-locked loop including
        a voltage-controlled oscillator for providing a loop output signal at a selected synthesizer output frequency;
        means coupled to the output of the voltage controlled oscillator for providing a sample signal at the phase and frequency of the loop output signal;
        a mixer for mixing the sample signal with the comb of signals to provide a plurality of upper and lower sideband signals with respect to the synthesizer output frequency that are separated from each other by the selected reference frequency; and
        a phase detector for comparing the phase of the IF signal to the phase of the one of the plurality of sideband signals that is at a frequency closest to the intermediate frequency to thereby provide a comparison output signal;
    a range selector circuit for providing a selected range-control signal that is one of a given plural number of range-control signals representative of different frequency ranges; and
    means for combining the selected range-control signal with the comparison output signal to tune the voltage controlled oscillator to provide the loop output signal at the selected synthesizer output frequency.

2. A frequecy synthesizer according to claim 1, further comprising
    means for processing an input signal identifying the selected synthesizer output frequency to provide a crystal-select signal, an intermediate frequency-select signal, a sideband-select signal and a range-select signal;
    wherein the crystal oscillator is adapted for determining which frequency is selected as the reference frequency in accordance with the crystal-select signal;
    wherein the IF generator is adapted for determining which submultiple is applicable in accordance with the intermediate frequency-select signal;
    wherein the phase detector is adapted for determining whether the upper or lower sideband signals are compared with the IF signal in accordance with the sideband-select signal; and
    wherein the range selector circuit is adapted for determining which range-control signal is provided in accordance with the range-select signal.

3. A frequency synthesizer according to claim 1, wherein the crystal oscillator circuit contains said given number of crystals having different characteristics for defining said given number of different predetermined frequencies from which the reference frequency may be selected.

4. A frequency synthesizer according to claim 3, wherein said different predetermined frequencies are sufficiently close that the crystal oscillator includes a single crystal oscillator that is tuned to operate at either frequency; and
    the crystal oscillator circuit includes means for selecting only one of the crystals for inclusion therein for operation at the selected reference frequency.

5. A frequency synthesizer according to claim 1, wherein the means coupled to the output of the voltage controlled oscillator for providing the sample signal includes an isolator for minimizing the appearance of the comb of signals or the cross-product of mixing signals in the loop output signal.

* * * * *